(12) United States Patent
Chang et al.

(10) Patent No.: US 7,511,407 B2
(45) Date of Patent: Mar. 31, 2009

(54) OPTICAL FILTER OF PLASMA DISPLAY PANEL AND FABRICATION METHOD THEREOF

(75) Inventors: Myeong Soo Chang, Gyeonggi-Do (KR); Hong Rae Cha, Seoul (KR); Byung Gil Ryu, Seoul (KR); Kyung Ku Kim, Seoul (KR); Young Sung Kim, Gyeonggi-Do (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 10/852,432

(22) Filed: May 25, 2004

(65) Prior Publication Data

US 2004/0239248 A1    Dec. 2, 2004

(30) Foreign Application Priority Data

May 28, 2003   (KR) ............... 10-2003-0034111

(51) Int. Cl.
- *H01J 5/16*    (2006.01)
- *H01J 17/49*   (2006.01)
- *H01K 1/26*    (2006.01)

(52) U.S. Cl. ............ 313/112; 313/110; 313/582; 313/634; 313/635; 313/313

(58) Field of Classification Search .......... 313/112
See application file for complete search history.

(56) References Cited

U.S. PATENT DOCUMENTS

| 6,150,754 A * | 11/2000 | Yoshikawa et al. ......... 313/313 |
| 6,229,085 B1 * | 5/2001 | Gotoh et al. ............... 313/134 |
| 2002/0050783 A1 * | 5/2002 | Kubota et al. ............. 313/495 |
| 2003/0007341 A1 * | 1/2003 | Shimamura et al. ........ 361/816 |
| 2003/0094296 A1 * | 5/2003 | Kojima et al. ........... 174/35 MS |

FOREIGN PATENT DOCUMENTS

| EP | 1 134 072 A2 | 9/2001 |
| EP | 1 195 991 A1 | 4/2002 |
| EP | 1 253 816 A2 | 10/2002 |

OTHER PUBLICATIONS

Chinese Office Action dated Aug. 15, 2008 with English Translation.

* cited by examiner

*Primary Examiner*—Nimeshkumar D. Patel
*Assistant Examiner*—Natalie K Walford
(74) *Attorney, Agent, or Firm*—Ked & Associates LLP

(57) ABSTRACT

An optical filter of a plasma display panel (PDP) and its fabrication method are disclosed. The optical filter includes an electromagnetic wave shield layer having a bias angle formed by cutting a mesh film along a predetermined direction.

22 Claims, 6 Drawing Sheets

FIG. 3
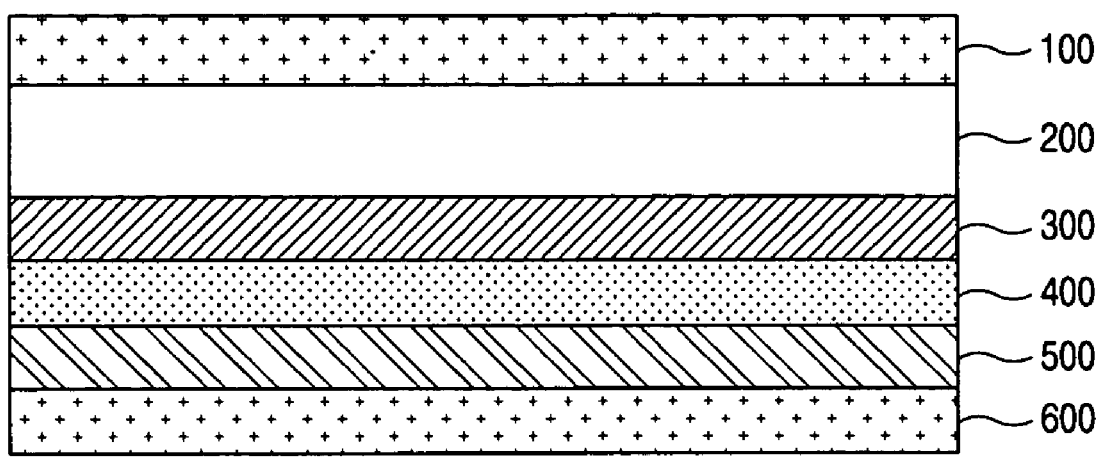
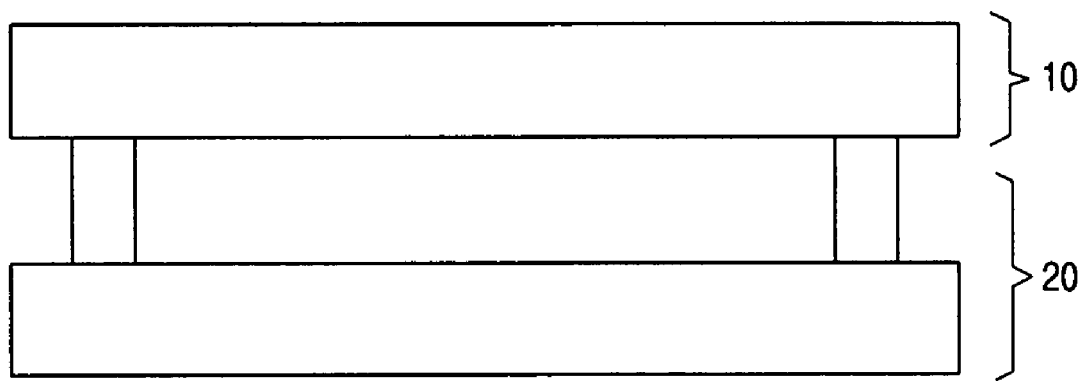

OPTICAL FILTER OF PLASMA DISPLAY PANEL AND FABRICATION METHOD THEREOF

BACKGROUND OF THE INVENTION

1. Field of the Invention

The present invention relates to a PDP (Plasma Display Panel) and, more particularly, to an optical filter of the PDP and its fabrication method.

2. Description of the Background Art

Lately, the PDP, a TFT-LCD (Thin Layer Transistor-Liquid Crystal Display), an organic EL (ElectroLuminescence), an FED (Field Emission Display) or the like has been developed as a next-generation digital multimedia display device. Among them, the PDP receives much attention in markets with its merits compared to other display devices.

The PDP is a display device using radiation phenomenon generated when 147 nm ultraviolet generated as He+Xe or Ne+Xe gas is discharged excites R, G and B fluorescent materials in discharge cells formed by barrier ribs. The PDP is most expected display device for a large screen of greater than 40 inches thanks to its advantages of facilitation of fabrication according to a simple structure, high luminance, high efficiency, a memory function, high nonlinearity and a wide angular field of greater than 160°.

A discharge cell of a three-electrode AC surface discharge type PDP having such characteristics will now be described.

FIG. 1 is a perspective view showing a discharge cell of a general three-electrode AC surface discharge type PDP.

As shown in FIG. 1, a discharge cell of the PDP is formed by coupling one front plate 10 and a back plate 20 and injecting a discharge gas therebetween.

The front plate 10 includes: an upper glass substrate 11; a transparent electrode 12 and a bus electrode 13 formed on the upper glass substrate 11; an upper dielectric layer 14 formed at the entire surface of the upper glass substrate 11 including the transparent electrode 12 and the bus electrode 13; and a protection layer 15 formed at the entire surface of the upper dielectric layer 14 to protect the upper dielectric layer 14 against plasma discharge.

The back plate 20 includes: a lower glass substrate 25; an address electrode 14 formed on the lower glass substrate 25; a lower dielectric layer 23 formed at the entire surface of the lower glass substrate 25 including the address electrode 24; a barrier rib 22 formed on the lower dielectric layer 23 to form a discharge cell; and a phosphor 21 formed at the entire surface of the lower dielectric layer 23 and the barrier rib 22.

An optical filter is installed at the entire surface of the thusly constructed PDP in order to prevent reflection of an external light, shield near infrared ray, shield electromagnetic wave and enhance a color purity.

A method for fabricating an electromagnetic wave shield layer for shielding electromagnetic wave discharged from the PDP, which constitutes the optical filter of the PDP, in accordance with a conventional art will now be described with reference to FIG. 2.

FIG. 2 is a flow chart of a method for fabricating an electromagnetic wave shield layer of the optical filter of the PDP in accordance with the conventional art.

As shown in FIG. 2, the conventional method for fabricating an electromagnetic wave shield layer of the optical filter of the PDP includes: forming a base film and winding the base film on a rotating roll (step S31); cutting the wound base film into a predetermined size (step S32); depositing a mesh metal on the cut base film (step S33); and patterning the deposited mesh metal to form a mesh film (step S34).

The conventional method for fabricating an electromagnetic wave shield layer of the optical filter of the PDP will be described in detail as follows.

First, the base film is formed and then wound on the rotating roll (step S31). The base film is formed as a metal foil is laminated on polyethylene terephthalate (PET). The base film wound on the rotating roll is cut to a predetermined size (step S32).

Thereafter, the mesh metal is deposited on the base film which has been cut to the predetermined size (step S33), and then patterned through a photolithography process including an exposing and developing process using a photomask and an etching process (step S34). As for the photomask, a transmission part and a blocking part of the photomask differ in its alignment form according to various resolutions, so a bias angle ($\theta$) is controlled according to a type of the photomask.

As the mesh film having a conductive mesh is formed on the base film through the patterning process, the optical filter of the PDP adopting the electromagnetic wave shield layer 300 in accordance with the conventional art is formed.

As mentioned above, the conventional method for fabricating the electromagnetic wave shield layer has the following problem.

That is, whenever the mesh metal is deposited on the base film and patterned in order to control the predetermined bias angle according to various resolutions of the PDP, photomasks corresponding to the various resolutions of the PDP are required.

SUMMARY OF THE INVENTION

Therefore, an object of the present invention is to provide an optical filter of a PDP and its fabrication method capable of forming an electromagnetic wave shield layer having a predetermined bias angle according to various resolutions of a PDP with the same photomask by controlling a cut direction of a mesh film having a conductive mesh according to resolution of the PDP.

To achieve these and other advantages and in accordance with the purpose of the present invention, as embodied and broadly described herein, there is provided an optical filter of a PDP includes an electromagnetic wave shield layer having a bias angle formed by cutting a mesh film along a predetermined direction.

To achieve the above object, there is also provided a method for fabricating an optical filter of a PDP including: forming an electromagnetic wave shield layer having a bias angle formed by cutting a mesh film along a predetermined direction.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 3 is a sectional view showing a structure of an optical filter of a PDP employing an electromagnetic wave shield layer in accordance with a first embodiment of the present invention;

DETAILED DESCRIPTION OF THE PREFERRED EMBODIMENTS

Figure 1:
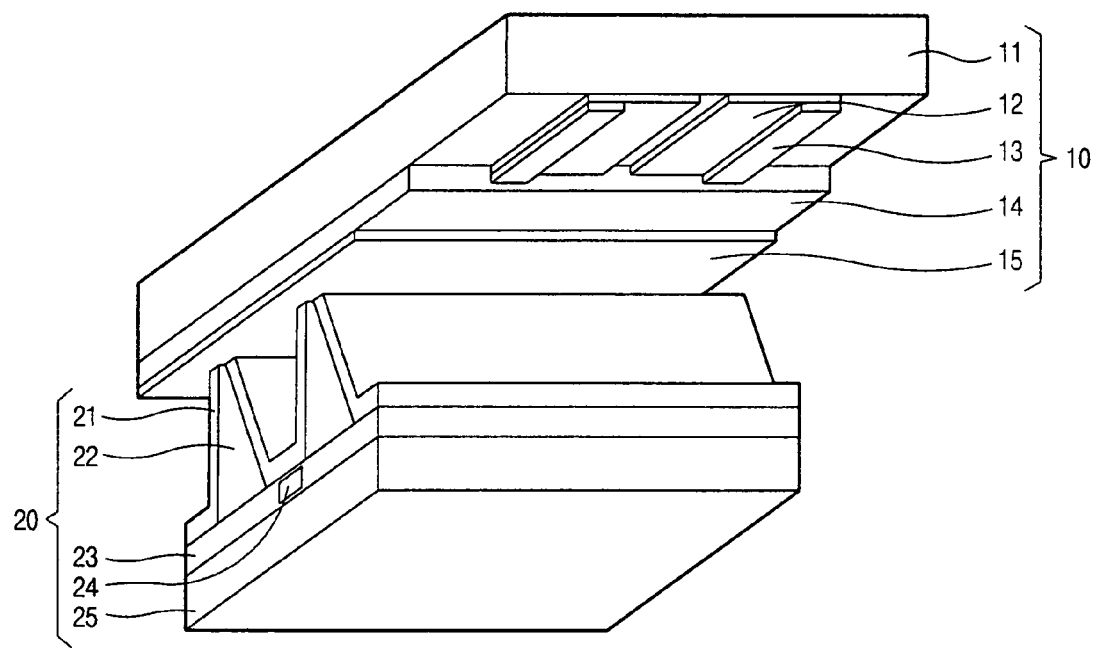
FIG. 1 is a perspective view showing a discharge cell structure of a three-electrode AC surface discharge type PDP in accordance with a conventional art.
Figure 2:
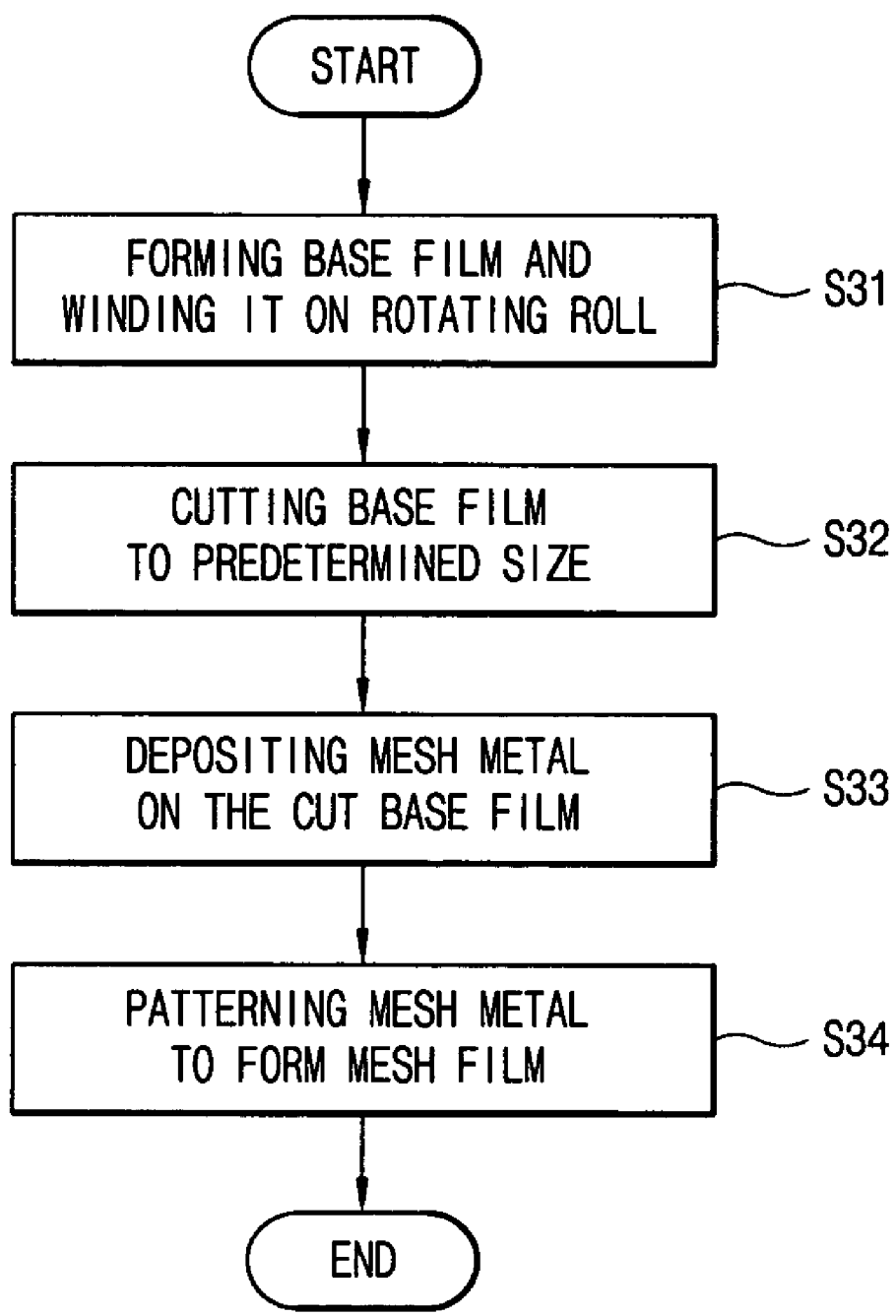
FIG. 2 is a flow chart of a method for fabricating an electromagnetic wave shield layer constituting an optical filter of the PDP in accordance with the conventional art.

Reference will now be made in detail to the preferred embodiments of the present invention, examples of which are illustrated in the accompanying drawings.

An optical filter of a PDP and its fabrication method capable of forming an electromagnetic wave shield layer having a predetermined bias angle according to various resolutions of a PDP with the same photomask by controlling a cut direction of a mesh film having a conductive mesh according to resolution of the PDP, in accordance with a preferred embodiment of the present invention will now be described with reference to the accompanying drawings.

FIG. 3 is a sectional view showing a structure of an optical filter of a PDP employing an electromagnetic wave shield layer in accordance with a first embodiment of the present invention.

As shown in FIG. 3, an optical filter of a PDP in accordance with the first embodiment of the present invention includes: a glass substrate 200; a first anti-reflection layer 100 attached at an upper surface of the glass substrate 200 and preventing reflection of an external light; an electromagnetic wave shield layer 300 attached at a lower surface of the glass substrate 200 and shielding discharge of electromagnetic wave; a near infrared shield layer 400 attached at a lower surface of the electromagnetic wave shield layer 300 and shielding discharge of near infrared ray; a color compensation layer 500 attached at a lower surface of the near infrared shield layer 400 and controlling a color purity; and a second anti-reflection layer 600 attached at a lower surface of the color compensation layer 500 and preventing reflection of an external light.

A method for fabricating the optical filter of a PDP employing the electromagnetic wave shield layer in accordance with the first embodiment of the present invention will now be described with reference to FIG. 4.

Figure 4:
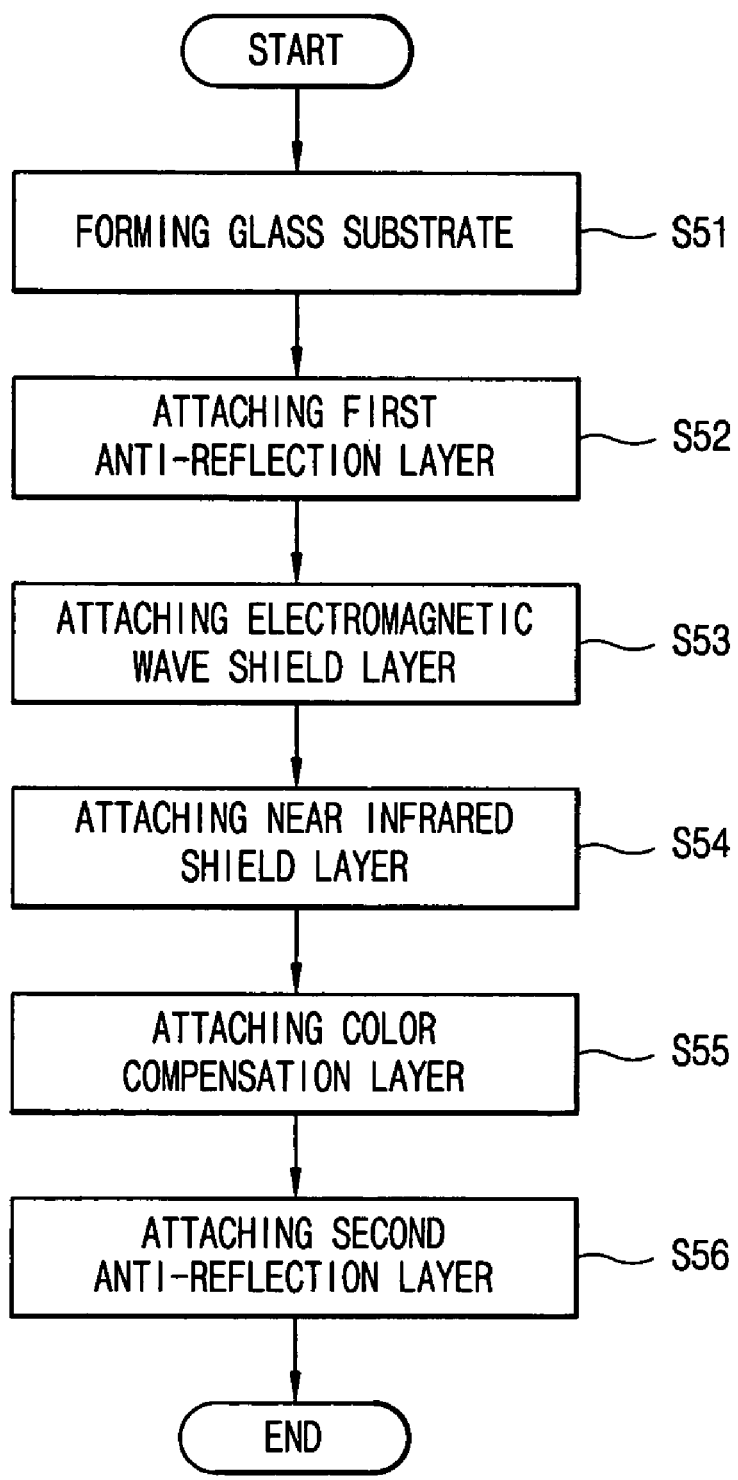
FIG. 4 is a flow chart of a method for fabricating the optical filter of a PDP employing an electromagnetic wave shield layer in accordance with the first embodiment of the present invention.

FIG. 4 is a flow chart of a method for fabricating the optical filter of a PDP employing an electromagnetic wave shield layer in accordance with the first embodiment of the present invention.

As shown in FIG. 4, the method for fabricating the optical filter of a PDP employing an electromagnetic wave shield layer in accordance with the first embodiment of the present invention, includes: forming the glass substrate 200 (step S51); attaching the first anti-reflection layer 100 for preventing reflection of an external light at the upper surface of the glass substrate 200 (step S52); attaching the electromagnetic wave shield layer 300 for shielding discharge of electromagnetic wave at the lower surface of the glass substrate 200 (step S53); attaching the near infrared shield layer 400 for shielding discharge of near infrared ray at the lower surface of the electromagnetic wave shield layer 300 (step S54); attaching the color compensation layer 500 for controlling a color purity at the lower surface of the near infrared shield layer 400 (step S55); and attaching the second anti-reflection layer 600 for preventing reflection of an external light at the lower surface of the color compensation layer 500 (step S56).

The method for fabricating the optical filter of a PDP employing the electromagnetic wave shield layer in accordance with the first embodiment of the present invention will now be described in detail.

First, the glass substrate 200 is formed with tempered glass to support the optical filter and protect the optical filter and the PDP against damage due to an external impact (step S51).

The first anti-reflection layer 100 is attached at the upper surface of the glass substrate 200 to prevent reflection of light made incident from outside, thereby improving a contrast of the PDP (step S52).

The electromagnetic wave shield layer 300 is attached at the lower surface of the glass substrate 200 to absorb electromagnetic wave generated from the PDP to prevent its discharge externally (step S53).

The electromagnetic wave shield layer 300 having such characteristics will be described with reference to FIGS. 5 and 6 as follows.

Figure 5:
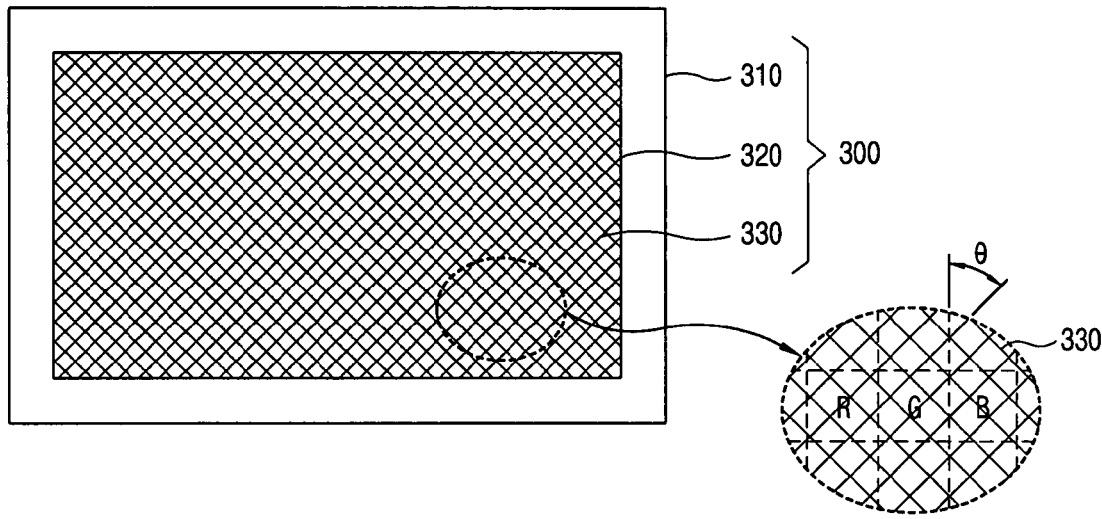
FIG. 5 illustrates a structure of the electromagnetic wave filter layer in accordance with the first embodiment of the present invention.

FIG. 5 illustrates a structure of the electromagnetic wave filter layer in accordance with the first embodiment of the present invention.

As shown in FIG. 5, the electromagnetic wave shield layer 300 in accordance with the first embodiment of the present invention includes; a mesh part 320 having conductive meshes 330 in a grid structure; and a metal frame 310 formed to surround an outer edge of the mesh part 320.

The method for fabricating the electromagnetic wave shield layer in accordance with the first embodiment of the present invention will now be described with reference to FIG. 6.

Figure 6:
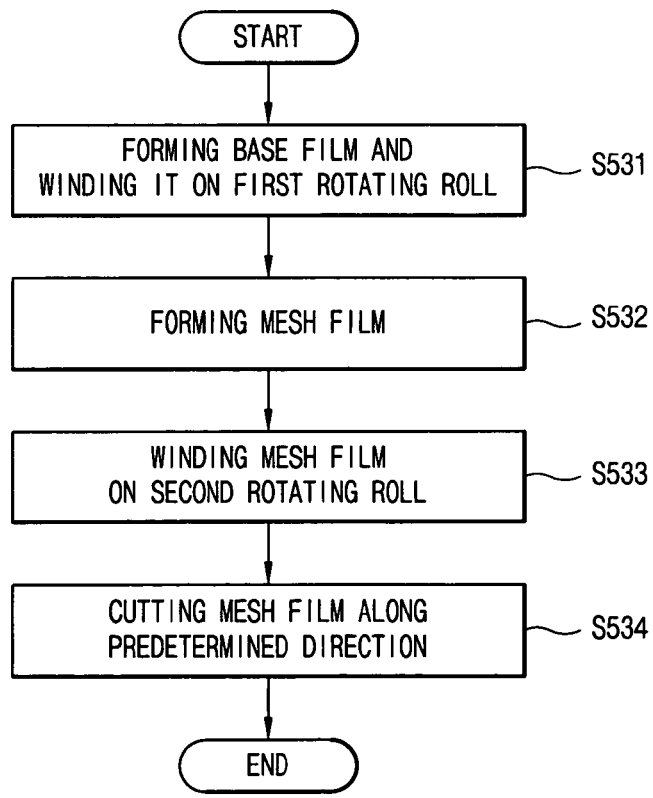
FIG. 6 is a flow chart of a method for fabricating the electromagnetic wave shield layer in accordance with the first embodiment of the present invention.

FIG. 6 is a flow chart of a method for fabricating the electromagnetic wave shield layer in accordance with the first embodiment of the present invention.

As shown in FIG. 6, the method for fabricating the electromagnetic wave shield layer in accordance with the present invention includes: forming a base film and winding it on a first rotating roll (step S531); depositing a mesh metal on the base film flattened by rotating the first rotating roll and patterning the deposited mesh metal to form a mesh film (step S532); winding the mesh film on a second rotating roll (step S533); and cutting the base film wound on the second rotating roll along a predetermined direction (step S534).

The method for fabricating the electromagnetic wave shield layer in accordance with the first embodiment of the present invention will now be described in detail.

First, after the base film is formed, it is wound on the first rotating roll (step S531). The base film has a double-layer structure including a PET (Polyethylene Terephthalate) and a metal thin layer formed through a laminating process at an upper surface of the PET.

The mesh metal is deposited on the base film flattened by rotating the first rotating roll. Preferably, the mesh metal has relatively good conductivity such as Ag or Cu. By patterning the mesh metal deposited on the base film through exposing and developing processes with a photomask, the mesh film is formed (step S532).

Thereafter, the mesh film is wound on the second rotating roll (step S533) and then cut to a predetermined size (step S534). At this time, since the bias angle is controlled as the cut direction of the mesh film is controlled according to resolution of the PDP, the mesh part corresponding to various resolution of the PDP can be formed without changing the photomask.

Accordingly, as the metal frame is formed surrounding an outer edge of the mesh part, the electromagnetic wave shield layer is formed. Since the formed mesh part is grounded to ground power, it absorbs electromagnetic wave discharged from the PDP and discharges it, thereby shielding discharge of electromagnetic wave.

Next, the near infrared shield layer 400 for shielding discharge of near infrared ray by absorbing near infrared ray in the wavelength band of about 800~1000 nm generated from the PDP is attached at the lower surface of the electromagnetic wave shield layer 300. Thus, controlling infrared ray (about 947 nm) generated from a remote controller or the like can be normally inputted to an infrared receiving unit prepared in the PDP set without being interference by the infrared ray (step S54).

As color is controlled through a color dye at the lower surface of the near infrared shield layer 400, the color compensation layer 500 for enhancing color purity of the PDP is attached (step S55).

The second anti-reflection layer 600 for preventing reflection of light made incident from outside is attached at the lower surface of the color compensation layer 500 (step S56).

The first anti-reflection layer 200, the electromagnetic wave shield layer 300, the near infrared shield layer 400, the color compensation layer 500 and the second anti-reflection layer 600 are sequentially attached at the upper surface of the lower surface of the glass substrate with a pressure sensitive adhesive or an adhesive.

The thusly formed optical filter is installed at the entire surface of the PDP and performs functions of shielding electromagnetic wave, preventing reflection of external light, shielding near infrared ray and compensating color.

An optical filter of a PDP employing the electromagnetic wave shield layer in accordance with a second embodiment of the present invention will now be described with reference to FIG. 7.

The optical filter in accordance with the second embodiment of the present invention is capable of relatively reducing thickness and weight of the PDP set by directly attaching a mesh part at the entire surface of the PDP, rather than using the glass substrate constituting the optical filter of the PDP in accordance with the first embodiment of the present invention.

Figure 7:
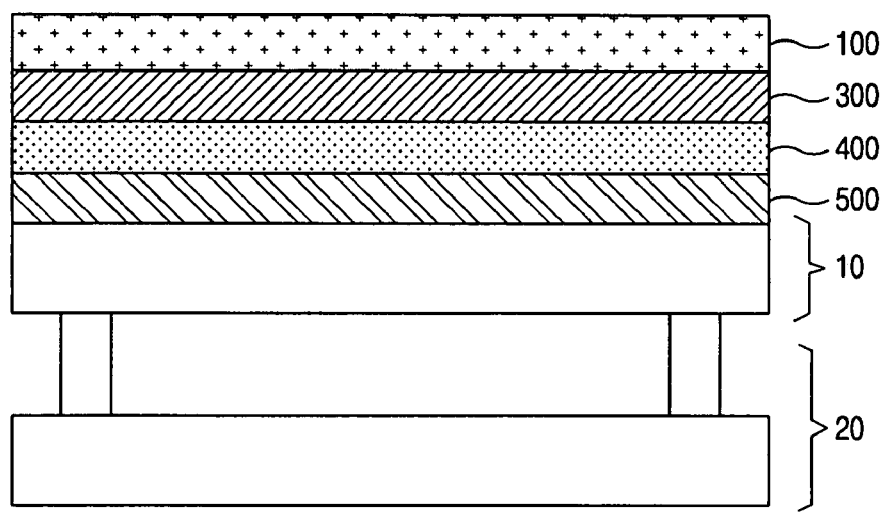
FIG. 7 is a sectional view showing a structure of an optical filter of a PDP employing an electromagnetic wave shield layer in accordance with a second embodiment of the present invention.

FIG. 7 is a sectional view showing a structure of an optical filter of a PDP employing an electromagnetic wave shield layer in accordance with a second embodiment of the present invention.

As shown in FIG. 7, the optical filter of a PDP employing the electromagnetic wave shield layer in accordance with a second embodiment of the present invention includes: a color compensation layer 500, a near infrared shield layer 400, an electromagnetic wave shield layer 300 and an anti-reflection layer 100 sequentially formed on the PDP.

Except for the electromagnetic wave shield layer 300, the color compensation layer 500, the near infrared shield layer 400, and the anti-reflection layer 100 are constructed and operated in the same manner as in the first embodiment of the present invention, so descriptions of which are omitted.

The electromagnetic wave shield layer 300 in accordance with the second embodiment of the present invention will now be described with reference to FIG. 8.

Figure 8:
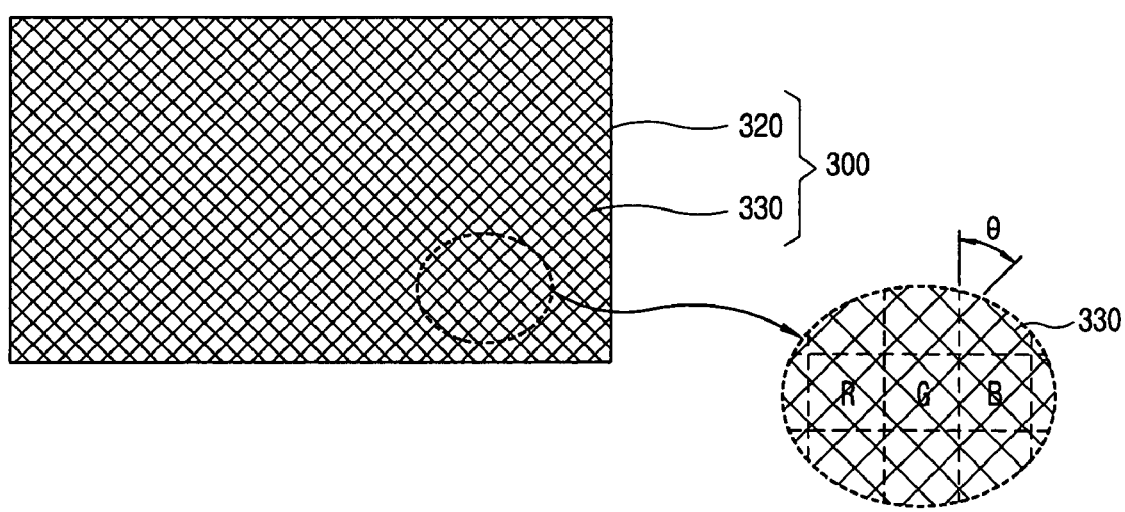
FIG. 8 illustrates a structure of the electromagnetic wave filter layer in accordance with the second embodiment of the present invention.

FIG. 8 illustrates a structure of the electromagnetic wave filter layer in accordance with the second embodiment of the present invention.

As shown in FIG. 8, the electromagnetic wave shield layer 300 in accordance with the second embodiment of the present invention includes a mesh part 320 having conductive meshes 300 in a grid structure.

The optical filter of a PDP employing the electromagnetic wave shield layer in accordance with the second embodiment of the present invention includes the mesh part 320 directly attached at the upper surface of the PDP without such a metal frame 310 as in the first embodiment and does not use such a glass substrate 200 as in the first embodiment. Thus, the thickness and weight of the PDP in accordance with the second embodiment of the present invention can be reduce compared to the PDP adopting the optical filter as in the first embodiment of the present invention.

As so far described, the optical filter of the PDP and its fabrication method in accordance with the present invention have the following advantage.

That is, for example, by controlling the cut direction of the mesh film constituting the conductive meshes according to the resolution of the PDP, the electromagnetic wave shield layer having a predetermined bias angle according to various resolution of the PDP can be formed with the same photomask.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An optical filter for a PDP (Plasma Display Panel) comprising:
   a base film positioned on an upper surface of a PDP having a pixel resolution; and
   a conductive mesh attached onto the base film, wherein the conductive mesh includes mesh lines in an inner grid that are tilted at an angle determined based on a cut direction of the conductive mesh, wherein said cut direction is based on the pixel resolution of the PDP, wherein the mesh lines in the inner grid are tilted at said angle relative to one or more horizontal or vertical barrier ribs of the PDP, and wherein the inner grid is arranged so that the mesh lines have a same predetermined number (N) of intersections overlapping each of a plurality of pixels or sub-pixels of the panel, where N>1.

2. The optical filter of claim 1, wherein the conductive mesh has a uniform grid structure.

3. The filter of claim 1, wherein the base film and conductive mesh form an electromagnetic wave shield layer, and wherein the conductive mesh comprises: a mesh part having conductive meshes having the mesh lines included in the inner grid.

4. The filter of claim 1, further comprising:
an anti-reflection layer attached at an upper surface of an electromagnetic wave shield layer formed from the base film and conductive mesh and preventing reflection of an external light;
a near infrared shield layer attached at a lower surface of the electromagnetic wave shield layer and shielding discharge of near infrared ray; and
a color compensation layer attached at a lower surface of the near infrared shield layer and controlling a color purity.

5. The filter of claim 4, wherein the anti-reflection layer, the electromagnetic wave shield layer, the near infrared shield layer and the color compensation layer are attached with a pressure sensitive adhesive or an adhesive.

6. The filter of claim 1, wherein the mesh lines are tilted at said angle based on a width of the barrier ribs or a gap between the barrier ribs of the PDP, and wherein an area that includes a gap between barrier ribs and widths of the barrier ribs in each of the pixels or sub-pixels includes the same predetermined number of intersections of the mesh lines.

7. The filter of claim 1, wherein:
a first plurality of the mesh lines are tiled at substantially a same first angle relative to a vertical axis passing through the plasma display panel,
a second plurality of mesh lines cross the first plurality of mesh lines and are tilted at substantially a same second angle relative to the vertical axis, and
the first angle is a negative complement of the second angle.

8. The filter of claim 7, wherein the first and second pluralities of mesh lines cross to define areas that have a same geometrical pattern throughout the conductive mesh.

9. An optical filter, comprising:
a base film on an upper surface of a plasma display panel; and
a conductive mesh coupled to the base film and including:
a first plurality of the mesh lines tiled at substantially a same first angle relative to a vertical axis passing through the plasma display panel, and
a second plurality of mesh lines crossing the first plurality of mesh lines and tilted at substantially a same second angle relative to the vertical axis, wherein the first angle is a negative complement of the second angle, wherein the first and second pluralities of mesh lines are tilted at said first and second angles respectively, based on a cut direction of the conductive mesh which is based on a pixel resolution of the plasma display panel, and wherein the first and second pluralities of mesh lines cross to form a same predetermined number (N) of intersections overlapping each of a plurality of pixels or sub-pixels of the panel, where N>1.

10. The filter of claim 9, wherein the first and second pluralities of mesh lines cross to define areas that have a same geometrical shape throughout the conductive mesh.

11. An optical filter, comprising:
a base film on an upper surface of a plasma display panel; and
a conductive mesh coupled to the base film and including:
a first plurality of the mesh lines tiled at substantially a same first angle relative to a vertical axis passing through the plasma display panel, and
a second plurality of mesh lines crossing the first plurality of mesh lines and tilted at substantially a same second angle relative to the vertical axis, wherein the first and second pluralities of mesh lines cross to define areas that have a same geometrical shape throughout substantially all of the conductive mesh, wherein the first angle is a negative complement of the second angle, wherein the first and second pluralities of mesh lines are tilted at said first and second angles, respectively, based on a cut direction of the conductive mesh, said cut direction based on a pixel resolution of the plasma display panel, and wherein the first and second pluralities of mesh lines cross to form a same predetermined number (N) of intersections overlapping each of a plurality of pixels or sub-pixels of the panel, where N>1.

12. An optical filter, comprising:
a base film on an upper surface of a plasma display panel; and
a conductive mesh coupled to the base film and including:
a first plurality of the mesh lines tiled at substantially a same first angle relative to a vertical axis passing through the plasma display panel, and
a second plurality of mesh lines crossing the first plurality of mesh lines and tilted at substantially a same second angle relative to the vertical axis, wherein the first and second pluralities of mesh lines cross to define areas that have a same geometrical shape throughout substantially all of the conductive mesh, wherein the first angle is different from the second angle, wherein the first and second pluralities of mesh lines are tilted at said first and second angles, respectively, based on a cut direction of the conductive mesh, said cut direction based on a pixel resolution of the plasma display panel, and wherein the first and second plurality of mesh lines cross to form a same predetermined number (N) of intersections overlapping each of a plurality of pixels or sub-pixels of the panel, where N>1.

13. An electromagnetic wave shielding layer for a panel comprising: a base member; and a conductive mesh on the base member and having a particular bias angle corresponding to a desired pixel resolution, wherein the conductive mesh results from processing a conductive mesh film according to a particular cutting procedure resulting in the particular bias angle that achieves the desired pixel resolution, wherein mesh lines in the mesh cross to from a same predetermined number (N) of intersections overlapping each of a plurality of pixels or sub-pixels of the panel, where N>1.

14. The electromagnetic wave shielding layer of claim 13, wherein the conductive mesh comprises a first set of parallel uniform mesh lines and a second set of parallel uniform mesh lines that intersect each other to form a uniform grid-like configuration.

15. The electromagnetic wave shielding layer of claim 14, wherein the bias angle corresponds to an angle formed by a mesh line with respect to a linear barrier rib of pixel cells beneath the electromagnetic wave shielding layer.

16. The electromagnetic wave shielding layer of claim 15, wherein the bias angle depends upon the processing of the conductive mesh film instead of the type of photomask used in photolithography.

17. The electromagnetic wave shielding layer of claim 16, wherein the conductive mesh results from cutting the conductive mesh film along a particular direction at a particular angle such that the particular bias angle is achieved.

18. The electromagnetic wave shielding layer of claim 17, wherein the conductive mesh film results from photolithography without employing different types of photomasks that respectively achieve different pixel resolutions.

19. The electromagnetic wave shielding layer of claim 18, wherein the conductive mesh film results from photolithography employing a single type of photomask.

20. The electromagnetic wave shielding layer of claim 13, wherein the base member and the conductive mesh are implemented in a display device.

21. The electromagnetic wave shielding layer of claim 13, wherein the base member and the conductive mesh are implemented together with at least one of an anti-reflection layer, a near infrared shield layer, and a color compensation layer to form an optical filter of a display device.

22. The electromagnetic wave shielding layer of claim 13, wherein the base member is a glass substrate or a base film.

* * * * *